(12) United States Patent
Wormmeester

(10) Patent No.: US 10,236,885 B1
(45) Date of Patent: Mar. 19, 2019

(54) DIGITAL OUTPUT BUFFER WITH FIELD STATUS FEEDBACK

(71) Applicant: Honeywell International Inc., Morris Plains, NJ (US)

(72) Inventor: Erik Wormmeester, Brabant (NL)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 15/942,712

(22) Filed: Apr. 2, 2018

(51) Int. Cl.
*H03K 17/16* (2006.01)
*H03K 19/003* (2006.01)
*H03K 19/0185* (2006.01)

(52) U.S. Cl.
CPC ........... *H03K 19/018507* (2013.01); *H03K 19/00315* (2013.01)

(58) Field of Classification Search
None
See application file for complete search history.

(56) References Cited

U.S. PATENT DOCUMENTS

| | | | |
|---|---|---|---|
| 4,979,066 A * | 12/1990 | Kawata | G05F 1/66 323/276 |
| 5,231,311 A | 7/1993 | Ferry et al. | |
| 5,656,947 A | 8/1997 | Opris | |
| 5,672,917 A * | 9/1997 | Nakano | G01R 31/3277 307/116 |
| 6,236,238 B1 | 5/2001 | Tanji et al. | |
| 6,433,983 B1 | 8/2002 | Fechner | |
| 6,552,568 B2 | 4/2003 | Esch | |
| 6,563,342 B1 | 5/2003 | Fulkerson | |
| 7,545,175 B2 | 6/2009 | Chen | |
| 8,392,626 B2 | 3/2013 | Wormmeester et al. | |
| 9,467,140 B2 | 10/2016 | Wormmeester | |
| 9,875,786 B2 | 1/2018 | Arai et al. | |
| 9,881,665 B2 | 1/2018 | Takeda et al. | |
| 2002/0093366 A1 * | 7/2002 | Fotouhi | H03K 19/00315 327/108 |

OTHER PUBLICATIONS

Control and Automation, Solutions Guide, Maxim Innovation Delivered, Edition 1, Dec. 2011, 150 pages.
Digital buffer—Wikipedia, printed Feb. 6, 2018, 3 pages.

\* cited by examiner

*Primary Examiner* — Anh Q Tran

(57) ABSTRACT

An output buffer apparatus that includes an electronic circuit composed of a buffer that electronically feeds an electronic status signal behind the buffer and into a digital output that drives the buffer. The electronic status signal provides a status signal indicative of the state of the field load in electrical communication with the electronic circuit. The digital output is buffered without losing the line-fault detection feature associated with that digital output. The disclosed output buffer apparatus can be implemented in the context of industrial control and automation systems.

15 Claims, 2 Drawing Sheets

DIGITAL OUTPUT BUFFER WITH FIELD STATUS FEEDBACK

TECHNICAL FIELD

Embodiments are generally related to industrial process control and automation systems. Embodiments are further related to methods and systems for buffering a digital output.

BACKGROUND

A digital buffer is an electronic circuit that increases the driving capability of a digital signal. The buffer output follows the digital state of the input. This means that the buffer output is low when the input is low and high when the input is high.

Digital outputs are often utilized in industrial process control and automation systems, and typically make use of, for example, multi-channel 24V digital outputs modules with a limited output drive capability. Many of these outputs have line-monitoring features that include lead-breakage and short-circuit detection in the field wiring and load. A variety of field loads may have a large (e.g., "in-rush") current. These field loads require a buffer. Usually that buffer will disable the line monitoring features of the output.

BRIEF SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

It is, therefore, one aspect of the disclosed embodiments to provide for an improved electronic apparatus for use in industrial process control and automation systems It is another aspect of the disclosed embodiments to provide for an apparatus and method for buffering a digital output without losing a line-fault detection feature with respect to that digital output.

It is yet another aspect of the disclosed embodiments to provide for a digital output buffer with field status feedback.

The aforementioned aspects and other objectives and advantages can now be achieved as described herein. An output buffer apparatus and method are disclosed, which include an electronic circuit comprising a buffer that electronically feeds an electronic status signal behind the buffer and into a digital output that drives the buffer. The electronic status signal provides a status signal indicative of the state of the field load in electrical communication with the electronic circuit. The digital output is buffered without losing the line-fault detection feature associated with that digital output. The disclosed output buffer apparatus can be implemented in the context of industrial control and automation systems.

The disclosed embodiments provide for a buffer that feeds the field-status behind the buffer back into the output that drives the buffer. In a first embodiment, for example, the output drives a relay (RE1) that operates as the buffer for the output. In a second example embodiment, a resistor (R1) and a diode (D1) are added to enable line monitoring on the field wiring and load. In a third example embodiment, a field state analyzer can be utilized to determine the field state. In a fourth example embodiment, the resulting field status can be fed back to the output.

In the case of a lead-breakage after the buffer, the relay is switched off (using a transistor T1). This removes all load on the input, which can be interpreted as a lead breakage by an associated industrial process controller or automation system. In the case of a short-circuit after the buffer, the output is shorted (using a transistor T2). This feature is detected and indicated as a short-circuit by the associated industrial process controller or automation system. Note that the aforementioned transistor T2 can also be implemented using other components such as (but not limited to), for example, a FET, a relay contact, a thyristor, or a triac.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

The particular values and configurations discussed in these non-limiting examples can be varied and are cited merely to illustrate at least one embodiment and are not intended to limit the scope thereof.

The embodiments will now be described more fully hereinafter with reference to the accompanying drawings, in which illustrative embodiments of the invention are shown. The embodiments disclosed herein can be embodied in many different forms and should not be construed as limited to the embodiments set forth herein; rather, these embodiments are provided so that this disclosure will be thorough and complete, and will fully convey the scope of the embodiments to those skilled in the art. As used herein, the term "and/or" includes any and all combinations of one or more of the associated listed items.

Reference will be made in detail to the disclosed embodiments (exemplary embodiments) of the invention, examples of which are illustrated in the accompanying drawings, and which may be preferred or alternative embodiments. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one" is used to mean that "one or more" of the listed items can be selected.

Figure 1:
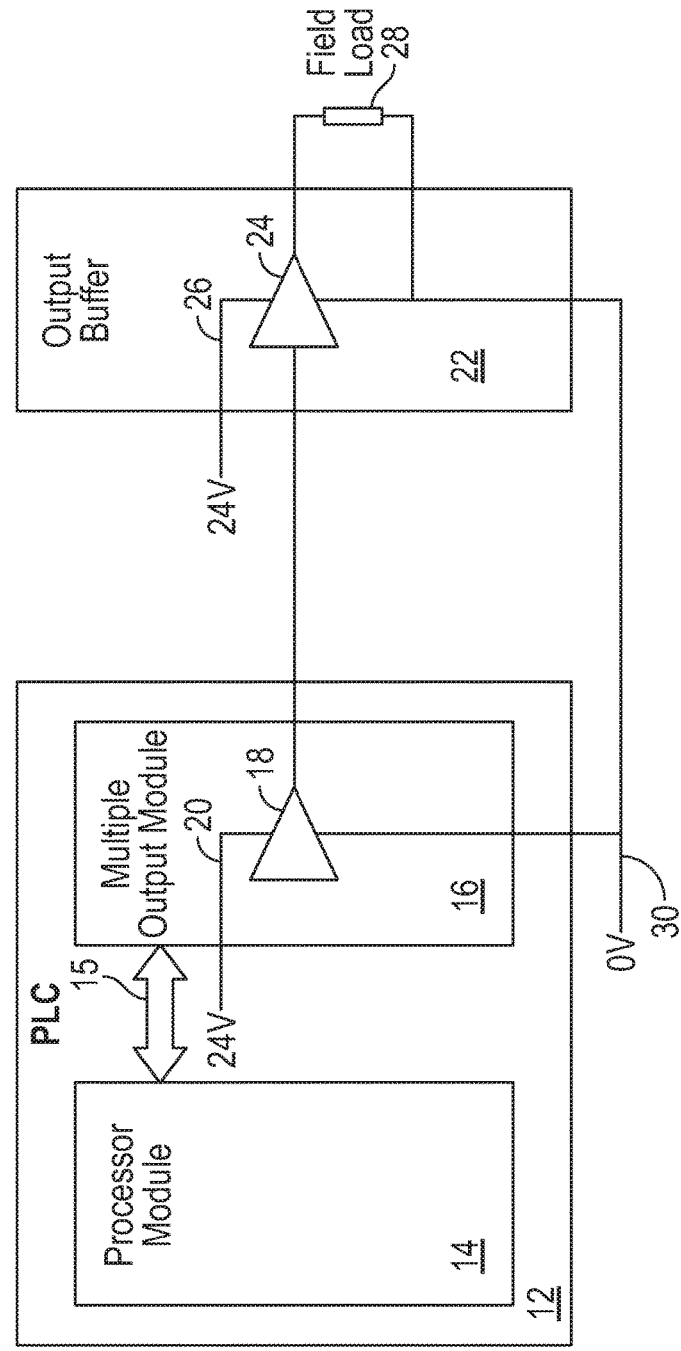
FIG. 1 illustrates a block diagram of an industrial process or automation system with a buffer and a field load, in accordance with an example embodiment.

FIG. 1 illustrates a block diagram of an industrial process or automation system 10 with an output buffer 22 and a field load 28, in accordance with an example embodiment. It should be appreciated that one or more of the components or modules shown in FIG. 1 can be implemented as an electronic circuit or a group of electronic circuits. For example, the output buffer 22 may be implemented as an electronic circuit or a group of electronic components. Similarly, a processor module 14 (e.g., one or more processors) and a multiple output module 16 can be implemented as electronic circuits as well.

The system 10 generally includes a PLC (Programmable Logic Controller) 12, which can be implemented as an electronic circuit that includes the processor module 14 and the multiple output module 16. The processor module 14 and the multiple output module 16 can communicate electronically with one another as indicated by the double arrow 15. The multiple output module 16 contains amplifiers 18 that connect to ground 30 and to a voltage 20 (e.g., 24 V). The output buffer 22 also contains an amplifier 24 that connects to ground 30 and to a voltage 26 (e.g., 24 V). The output from the amplifier 18 is fed as input to the amplifier 24. The amplifier 24 in turn connects electronically to the field load 28.

Figure 2:
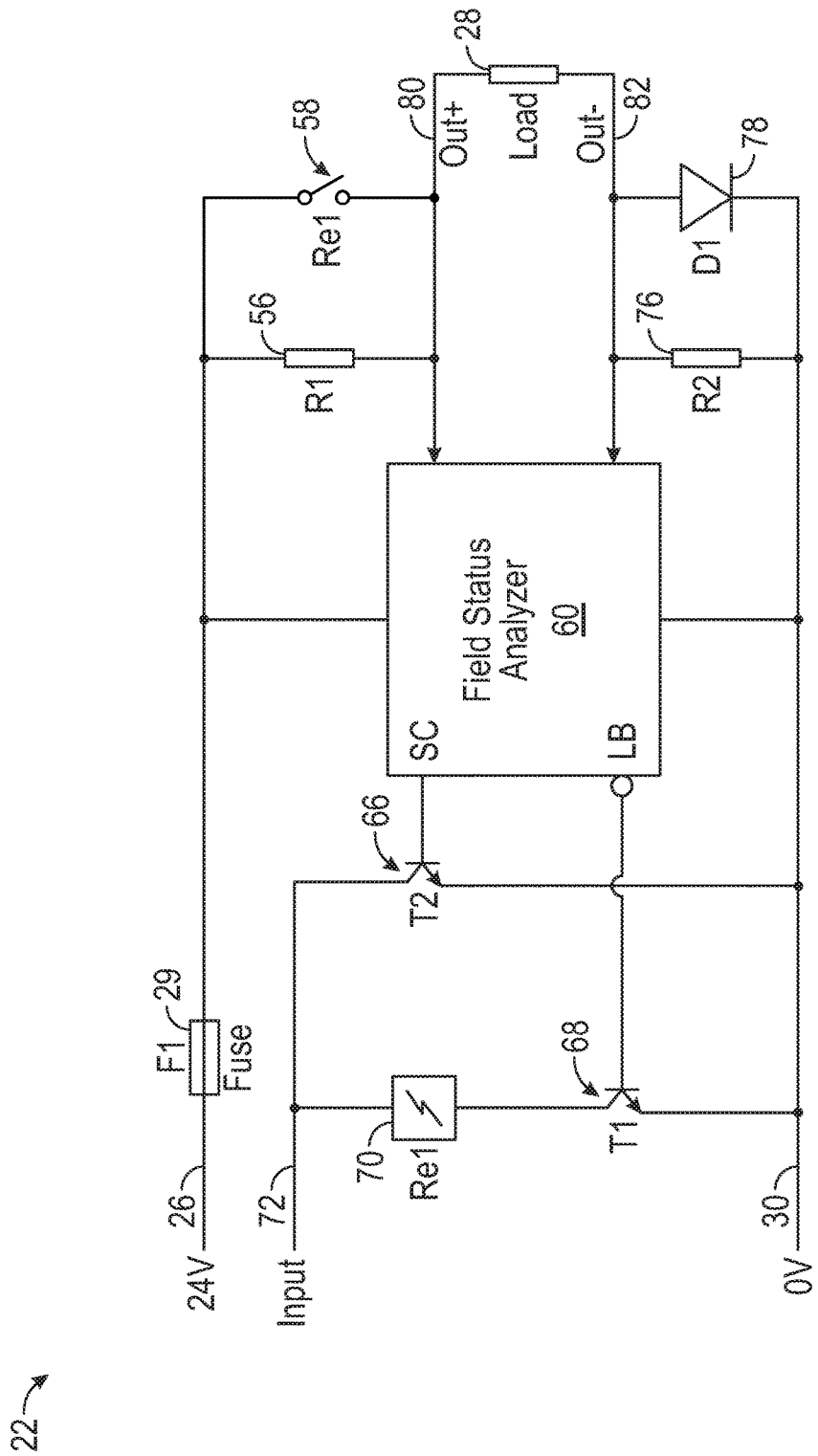
FIG. 2 illustrates a schematic diagram of a buffer circuit that includes a field status analyzer, in accordance with an example embodiment.

FIG. 2 illustrates a schematic diagram of a buffer 22 (i.e., an electronic circuit) arranged in a configuration that includes a field status analyzer 60, in accordance with an example embodiment. The buffer 22 generally connects to the voltage 26 (e.g., 24 V) and to ground 30 (0 V). A fuse 29 (shown as "F1" in FIG. 2) can be part of the output buffer 22 to protect the (field-) wiring in case of a field short occurring while the output is on. The field load 28 and the field status analyzer 60 can also connect electronically to a first resistor 56 (shown as "R1" in FIG. 2) and to a relay contact 58. An output signal 80 (shown as "OUT+") in FIG. 2) connects electronically to the field status analyzer 60 and to the first resistor 56 and the relay contact 58. An output signal 82 (shown as "OUT−" in FIG. 2) connects electronically to the field status analyzer 60 and to a second resistor 76 (shown as "R2" in FIG. 2) and to a diode 78 (shown as "D1" in FIG. 2).

The diode 78 and the second resistor 76 connect electronically to ground 30 and also to the field status analyzer 60. Note that the first resistor 56 or R1 functions as a lead breakage sense resistor, and the second resistor 76 or R2 functions as a field current sense resistor. In general, the field load 28 connects electronically to the second resistor 76 and the diode 78 at OUT− and to the first resistor and the relay contact 58 at OUT+.

The field status analyzer 60 is further connected electronically to ground 30 and to a first transistor 68 and a second transistor 66. The first and second transistors 68 and 66 further connect to an input line 72. The first transistor 68 further connects electronically to ground 30. The first transistor 68 also connects electronically with a relay 70, which in turn connects electronically to the input 72 and the transistor 66.

The buffer circuit (i.e., the buffer 22) shown in FIG. 2 demonstrates an example of electronic components that can be utilized to implement the aforementioned buffer 22. In normal situations, the input 72 of the buffer 22 is slow (e.g., not driven by the system output), and the relay contact 58 (RE1) is open and the field load 28 is un-powered (off). In addition, when the input of the buffer 22 is high (driven by the system output), the relay contact 58 energizes and the load 28 is powered.

The field status analyzer 60 operates as follows. The voltage drop over the diode 78 ("D1") is used to monitor the presence of a field current. If the field voltage (Out+) is high and no field current is detected, the field status analyzer 60 indicates a 'lead breakage' (LB) and stops driving the first transistor 68 ("T1"). If the field voltage (Out+) is very low, in spite of the current flowing via the first resistor 56 ("R1"), the field status analyzer 60 indicates a 'short circuit' (SC) and drives transistor 66 ("T2"). Note that the second resistor 76 ("R2") is used to detect the load current (e.g., set at a relatively low value) and the diode 78 carries the remainder of the field current (to limit the voltage drop over the field-current sense resistor 76).

It can thus be appreciated that an output buffer apparatus and method are disclosed herein, which include an electronic circuit comprising a buffer that electronically feeds an electronic status signal behind the buffer and into a digital output that drives the buffer. The electronic status signal provides a status signal indicative of the state of the field load in electrical communication with the electronic circuit. The digital output is buffered without losing the line-fault detection feature associated with that digital output. The disclosed output buffer apparatus can be implemented in the context of industrial control and automation systems.

The disclosed embodiments provide for a buffer that feeds the field-status behind the buffer back into the output that drives the buffer. In a first example embodiment, for example, the output drives a relay contact (RE1) that operates as the buffer for the output. The relay contact is preferably implemented electronically in parallel with a first resistor (R1) that functions as a lead breakage sensor resistor. In a second example embodiment, a second resistor (R2) and a diode (D1) can be added to enable line monitoring on the field wiring and load. This second resistor (R2) can function as a field current sensor resistor. In a third example embodiment, a field state analyzer can be utilized to determine the field state. In a fourth example embodiment, the resulting field status can be fed back to the output. In yet other example embodiments, both the aforementioned first and second resistors R1 and R2 can be implemented in the context of a buffer circuit, along with devices such as the aforementioned relay and relay contact (RE1), the diode (D1), the field state analyzer, and so on.

In the case of a lead-breakage after the buffer, the relay is switched off (using a transistor T1). This removes all load on the output which can be interpreted as a lead breakage by an associated industrial process controller or automation system. In the case of a short-circuit after the buffer, the output is shorted (using a transistor T2). This feature is detected and indicated as a short-circuit by the associated industrial process controller or automation system.

Based on the foregoing, it can be appreciated that a number of example embodiments (preferred and alternative embodiments) are disclosed herein. For example, in a preferred embodiment, an output buffer apparatus can be implemented, which is composed of an electronic circuit comprising one or more buffers that electronically feeds an electronic status signal behind the buffer (or buffers) in the electronic circuit and into an output that drives the buffer(s), wherein the electronic status signal provides a status signal indicative of the status of the state of the field load in electrical communication with the electronic circuit.

In another example embodiment, the status of the field load can include the status of the field current associated with the field load. In another example embodiment, the aforementioned electronic circuit can further include one or more relay contacts that operate as the buffer (or buffers) for the output. In still another example embodiment, the output buffer apparatus can further include a transistor that switches off the relay (or relays) in the event of a lead breakage after the buffer(s) in the electronic circuit. In another example embodiment, the aforementioned electronic circuit can incorporate the use of a second transistor wherein in the event of a short-circuit after the buffer(s) in the electronic circuit, the output is electrically shorted via this second transistor.

In still another example embodiment, the aforementioned electronic circuit can be further configured to include one or more relay contacts in parallel with a first resistor, wherein the first resistor and the relay contact(s) connect electronically to the field load and a field state analyzer, and the field load is further electronically connected to the field state analyzer. In another example embodiment, the output buffer apparatus can further include a second resistor electronically in parallel with a diode, wherein the second resistor and the diode enable line monitoring with respect to the field load and field wiring. The field state analyzer determines the status of the state of the field load. In addition, the aforementioned first resistor can function as a lead breakage sense resistor and the aforementioned second resistor can function as a field current sense resistor.

In yet another example embodiment, an output buffer apparatus can be configured, which includes an electronic circuit composed of one or more buffers that electronically feed an electronic status signal behind the buffer (or buffers) in the electronic circuit and into an output that drives the buffer(s). The electronic circuit further includes one or more relay contacts that operate as the buffer(s) for the output. In this example embodiment, the electronic status signal constitutes a status signal indicative of the status of the state of the field load in electrical communication with the electronic circuit. The status of the field load includes the status of the field current associated with the field load.

In still another example embodiment, an output buffer apparatus can be implemented, which includes an electronic circuit comprising one or more buffers that electronically feed an electronic status signal behind the buffer(s) in the electronic circuit and into an output that drives the buffer(s), wherein the electronic circuit further comprises one or more relay contacts in parallel with a first resistor. In this example embodiment, the first resistor and the relay contacts connect electronically to the field load and a field state analyzer. The field load is further electronically connected to the field state analyzer. The electronic status signal includes a status signal indicative of the state of the field load in electrical communication with the electronic circuit. The field state analyzer determines the state of the field load.

The preceding description of the disclosed example embodiments is provided to enable any person skilled in the art to make or use such example embodiments. Various modifications to these embodiments will be readily apparent to those skilled in the art, and the generic principles defined herein may be applied to other example embodiments without departing from the spirit or scope of the invention. Thus, the disclosed example embodiments are not intended to be limited to the particular embodiments shown and described herein but are to be accorded the widest scope consistent with the following claims and the principles and novel features disclosed herein.

The invention claimed is:

1. An output buffer apparatus, comprising:
an electronic circuit comprising at least one buffer that electronically feeds an electronic status signal behind said at least one buffer in said electronic circuit and into an output that drives said at least one buffer, wherein said electronic status signal comprises a status signal indicative of the status of a state of a field load in electrical communication with said electronic circuit, wherein said electronic circuit further comprises:
   at least one relay contact that operates as said at least one buffer for said output,
   a first transistor that switches off said at least one relay in the event of a lead breakage after said at least one buffer in said electronic circuit, and
   a second transistor wherein in the event of a short-circuit after said at least one buffer in said electronic circuit, said output is electrically shorted using said second transistor.

2. The apparatus of claim 1 wherein said status of said field load includes a status of a field current associated with said field load.

3. The apparatus of claim 1 wherein said electronic circuit further comprises at least one relay contact in parallel with a first resistor, wherein said first resistor and said at least one relay contact connect electronically to said field load and a field state analyzer, wherein said field load is further electronically connected to said field state analyzer.

4. The apparatus of claim 3 further comprising a second resistor electronically in parallel with a diode, wherein said second resistor and said diode enable line monitoring with respect to said field load and field wiring.

5. The apparatus of claim 3 wherein said field state analyzer determines said status of said state of said field load.

6. The apparatus of claim 3 wherein said first resistor comprises a lead breakage sense resistor and wherein said second resistor comprises a field current sense resistor.

7. An output buffer apparatus, comprising:
an electronic circuit comprising at least one buffer that electronically feeds an electronic status signal behind said at least one buffer in said electronic circuit and into an output that drives said at least one buffer, said electronic circuit further comprising at least one relay contact that operates as said at least one buffer for said output; and
wherein said electronic status signal comprises a status signal indicative of the status of a state of a field load in electrical communication with said electronic circuit and wherein said status of said field load includes a status of a field current associated with said field load, and
wherein said electronic circuit further comprises:
   at least one relay contact that operates as said at least one buffer for said output,
   a first transistor that switches off said at least one relay in the event of a lead breakage after said at least one buffer in said electronic circuit, and
   a second transistor wherein in the event of a short-circuit after said at least one buffer in said electronic circuit, said output is electrically shorted using said second transistor.

8. The apparatus of claim 7 wherein said at least one relay contact in parallel with a first resistor, wherein said first resistor and said at least one relay contact connect electronically to said field load and a field state analyzer, wherein said field load is further electronically connected to said field state analyzer.

9. The apparatus of claim 8 further comprising a second resistor electronically in parallel with a diode, wherein said second resistor and said diode enable line monitoring with respect to said field load and field wiring.

10. The apparatus of claim 8 wherein said field state analyzer determines said status of said state of said field load.

11. The apparatus of claim 8 wherein said first resistor comprises a lead breakage sense resistor and wherein said second resistor comprises a field current sense resistor.

12. The apparatus of claim 7 wherein said electronic circuit further comprises at least one relay contact in parallel with a first resistor, wherein said first resistor and said at least one relay contact connect electronically to said field load and a field state analyzer, wherein said field load is further electronically connected to said field state analyzer, wherein said field state analyzer determines said status of said state of said field load.

13. An output buffer apparatus, comprising:
an electronic circuit comprising at least one buffer that electronically feeds an electronic status signal behind said at least one buffer in said electronic circuit and into an output that drives said at least one buffer;
wherein said electronic circuit further comprises at least one relay contact in parallel with a first resistor, wherein said first resistor and said at least one relay contact connect electronically to a field load and a field state analyzer, wherein said field load is further electronically connected to said field state analyzer, and wherein said electronic status signal comprises a status signal indicative of the status of a state of said field load in electrical communication with said electronic circuit and wherein said field state analyzer determines said status of said state of said field load.

14. The apparatus of claim 13 further comprising a second resistor electronically in parallel with a diode, wherein said second resistor and said diode enable line monitoring with respect to said field load and field wiring.

15. The apparatus of claim 14 wherein said first resistor comprises a lead breakage sense resistor and wherein said second resistor comprises a field current sense resistor.

* * * * *